United States Patent
Huh et al.

(10) Patent No.: US 9,219,254 B2
(45) Date of Patent: Dec. 22, 2015

(54) METHOD OF FORMING NANOCRYSTALS AND METHOD OF MANUFACTURING AN ORGANIC LIGHT-EMITTING DISPLAY APPARATUS INCLUDING A THIN FILM HAVING NANOCRYSTALS

(71) Applicant: Samsung Display Co., Ltd., Yongin, Gyeonggi-do (KR)

(72) Inventors: Myung-Soo Huh, Yongin (KR); Suk-Won Jung, Yongin (KR); Tae-Wook Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/975,259

(22) Filed: Aug. 23, 2013

(65) Prior Publication Data

US 2014/0322837 A1 Oct. 30, 2014

(30) Foreign Application Priority Data

Apr. 26, 2013 (KR) .................. 10-2013-0046929

(51) Int. Cl.
*H01L 51/56* (2006.01)
*C23C 14/06* (2006.01)
*C23C 14/08* (2006.01)
*C23C 14/34* (2006.01)
*C23C 14/35* (2006.01)
*H01L 51/52* (2006.01)

(52) U.S. Cl.
CPC ............ *H01L 51/56* (2013.01); *C23C 14/0688* (2013.01); *C23C 14/08* (2013.01); *C23C 14/3464* (2013.01); *C23C 14/352* (2013.01); *H01L 51/5253* (2013.01)

(58) Field of Classification Search
CPC .................. Y02E 10/544; H01L 31/022483; H01L 31/0749; H01L 51/52; H01L 51/5206
USPC ........ 438/22, 104, 485; 257/40; 977/701–963
See application file for complete search history.

(56) References Cited

U.S. PATENT DOCUMENTS 6,608,439 B1 * 8/2003 Sokolik et al. ................ 313/512
7,297,642 B2 * 11/2007 Gao et al. ...................... 438/787
2002/0081848 A1 6/2002 Kim et al.

(Continued)

FOREIGN PATENT DOCUMENTS

KR 10-2004-0100136 A 12/2004
KR 10-2011-0047839 A 5/2011

(Continued)

OTHER PUBLICATIONS

Huh et al., "Improvement in the Performance of Tin Oxide Thin-Film Transistors by Alumina Doping" Aug. 2009, Electrochemical and Solid-State Letters, 12(10), H385-H387.*

(Continued)

*Primary Examiner* — Selim Ahmed
*Assistant Examiner* — Changhyun Yi
(74) *Attorney, Agent, or Firm* — Christie, Parker & Hale, LLP

(57) ABSTRACT

A method of forming nanocrystals includes loading a substrate into a chamber, applying a first voltage to a first target to form a thin film including a first metal compound on the substrate by sputtering, and applying a second voltage to a second target and forming nanocrystals in the thin film by sputtering.

19 Claims, 5 Drawing Sheets

(56) References Cited

U.S. PATENT DOCUMENTS

| | | | |
|---|---|---|---|
| 2006/0127266 A1 | 6/2006 | Miura et al. | |
| 2007/0042526 A1 | 2/2007 | Myeong et al. | |
| 2007/0103068 A1* | 5/2007 | Bawendi et al. | 313/506 |
| 2007/0181872 A1* | 8/2007 | Lee et al. | 257/40 |
| 2008/0160292 A1 | 7/2008 | Kim et al. | 428/331 |
| 2010/0084634 A1 | 4/2010 | Gamo et al. | |
| 2011/0062436 A1 | 3/2011 | Yamazaki et al. | |
| 2012/0126300 A1 | 5/2012 | Park et al. | |
| 2013/0112269 A1* | 5/2013 | Choi | 136/259 |

FOREIGN PATENT DOCUMENTS

| | | | |
|---|---|---|---|
| KR | 10-2012-0055363 A | 5/2012 | |
| KR | 10-2012-0082038 A | 7/2012 | |

OTHER PUBLICATIONS

Carreras et al., "Electrical and optical properties of Zn—In—Sn—O transparent conducting thin films" Dec. 2011, Thin Solid Films 520, 1223-1227.*

EPO Search Report dated Mar. 12, 2014, for corresponding European Patent application 13191102.6, (4 pages).

Huh, M., et al., *Improvement in the Performance of Tin Oxide Thin-Film Transistors by Alumina Doping*, Electrochemical and Solid-State Letters, vol. 12, No. 10, Oct. 2009, pp. H385-H387, XP002720374.

Carreras, P., et al *Electrical and optical properties of Zn—In—Sn—0 transparent conducting thin films*, Thin Solid Films, vol. 520, No. 4, Jun. 30, 2011 pp. 1223-1227, XP028334911.

* cited by examiner

METHOD OF FORMING NANOCRYSTALS AND METHOD OF MANUFACTURING AN ORGANIC LIGHT-EMITTING DISPLAY APPARATUS INCLUDING A THIN FILM HAVING NANOCRYSTALS

CROSS-REFERENCE TO RELATED APPLICATION

This application claims priority to and the benefit of Korean Patent Application No. 10-2013-0046929, filed on Apr. 26, 2013, in the Korean Intellectual Property Office, the disclosure of which is incorporated herein in its entirety by reference.

BACKGROUND

1. Field

Embodiments of the present invention relate to a method of forming nanocrystals in a thin film and a method of manufacturing an organic light-emitting display apparatus by using a thin film having nanocrystals formed therein.

2. Description of the Related Art

A vapor deposition method, an electrodeposition method, a chemical vapor deposition method, and a sputtering method are used in processes of forming thin films used in electronic components. Among these methods, the sputtering method has been widely used due to the fact that the microstructure and the composition of the formed thin film are highly controllable with high mass productivity.

A sputtering method (technique) is a film-forming technique in which plasma is used for generating ions which bombard a sputtering target so as to allow atoms of the sputtering target to be stacked as a layer on a substrate. In particular, the sputtering technique is used for forming thin films of metals, oxides, nitrides, and semiconductors in various manufacturing processes which are used in semiconductor and optoelectronic industries.

In a case where a thin film is deposited at a low temperature by using a sputtering technique, an amorphous thin film may be formed. However, such amorphous thin film may have limitations in increasing the density of the thin film or increasing (or improving) optical properties of the thin film. Many attempts have been made to overcome such limitations by doping or adding heterogeneous materials in a thin film process. However, the addition of the heterogeneous materials may cause the deterioration of other properties.

SUMMARY

Aspects of embodiments of the present invention are directed toward a method of forming a thin film including nanocrystals at a low temperature.

Aspects of embodiments of the present invention are directed toward a method of manufacturing an organic light-emitting display apparatus by using the thin film including nanocrystals.

According to an embodiment of the present invention, there is provided a method of forming nanocrystals including: loading a substrate into a chamber; applying a first voltage to a first target to form a thin film including a first metal compound on the substrate by sputtering; and applying a second voltage to a second target and forming nanocrystals in the thin film by sputtering.

The first target and the second target may include different metals.

The first metal compound may be a metal oxide or a metal nitride.

The second voltage may be higher than the first voltage.

A diameter of the nanocrystals may be determined by a value of the voltage applied to the second target.

The forming of the nanocrystals may include doping the thin film with a second metal compound from the second target.

A density of the nanocrystals may be determined by a doping amount of the second metal compound.

The first metal compound may be amorphous.

A thickness of the thin film may be about 100 nm or less.

A process temperature in the chamber may be about 100° C. or less.

A density of the thin film may be increased by the formation of the nanocrystals.

Optical bandgap energy of the thin film may be increased by the formation of the nanocrystals.

The nanocrystals may be formed by crystallization of at least one metal of the first metal compound and a second metal compound from the second target.

The first metal compound may include at least one of $SnO_x$, $ZnO$, $InO_x$, $TiO_x$, indium tin oxide (ITO), and $WO_x$.

According to another embodiment of the present invention, there is provided a thin film having nanocrystals formed by the above-described method of forming nanocrystals.

According to another embodiment of the present invention, there is provided a method of manufacturing an organic light-emitting display apparatus including: loading a substrate including at least some components of the organic light-emitting display apparatus into a chamber; applying a first voltage to a first target to form a thin film including a first metal compound on the substrate by sputtering; and applying a second voltage to a second target and forming nanocrystals in the thin film by sputtering.

The organic light-emitting display apparatus may include a first electrode, an intermediate layer including an organic light-emitting layer, a second electrode, and an encapsulation layer, the electrodes and layers being on the substrate and the thin film having the nanocrystals formed therein may be included in the encapsulation layer.

The encapsulation layer may include an organic layer and an inorganic layer.

The inorganic layer may include the thin film including the nanocrystals.

The thin film may be amorphous.

BRIEF DESCRIPTION OF THE DRAWINGS

The above and other features and aspects of embodiments of the present invention will become more apparent by describing in detail example embodiments thereof with reference to the attached drawings in which.

DETAILED DESCRIPTION

Figure 1:
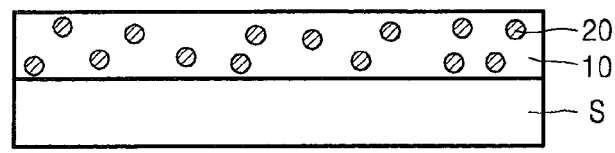
FIG. 1 is a schematic view illustrating a thin film including nanocrystals, according to an embodiment of the present invention.

Hereinafter, aspects of the present invention will be described in more detail by explaining embodiments of the present invention with reference to the attached drawings.

Like reference numerals in the drawings denote like elements. Moreover, detailed descriptions related to well-known functions or configurations may be ruled out in order not to unnecessarily obscure subject matters of embodiments of the present invention.

Expressions such as "at least one of," when preceding a list of elements, modify the entire list of elements and do not modify the individual elements of the list.

FIG. 1 is a schematic view illustrating a thin film 10 including nanocrystals 20, according to an embodiment of the present invention. Referring to FIG. 1, and in one embodiment, the nanocrystals 20 are formed in the thin film 10. Herein, the thin film 10 may be formed of a metal compound, and the metal compound may be a metal oxide or a metal nitride. The nanocrystals 20 may be formed of a metal.

For example, in one embodiment, the thin film 10 is formed of a metal (such as zinc (Zn), copper (Cu), indium (In), silver (Ag), tin (Sn), antimony (Sb), nickel (Ni), or iron (Fe)), including oxygen and/or nitrogen as a component. For example, in one embodiment, the thin film 10 is formed of a metal oxide, such as indium tin oxide (ITO), ZnO, $SnO_x$, $ZrO_x$, $TiO_x$, or $AlO_x$, and/or a metal nitride, such as TiN, SiN, or AlN. Also, the thin film 10 may be formed by doping a base metal compound formed of a metal compound, such as $SnO_x$, ZnO, $InO_x$, $TiO_x$, ITO, or $WO_x$, with a metal compound, such as $NiO_x$ or $SiO_x$.

The nanocrystals 20 may not only increase the density of the thin film 10, but may also increase (or improve) optical properties of the thin film 10 by being distributed in the thin film 10. Herein, the nanocrystals 20 may be formed of the same metal as that of the thin film 10. For example, in one embodiment, the metal constituting the nanocrystals 20 is one or more of Zn, Cu, In, Ag, Sn, Sb, Ni, and Fe. Also, a diameter of the nanocrystals 20 may be in a range of about 1 nm to about 20 nm. The diameter of the nanocrystals 20 may be controlled by values of voltages applied to targets 122A and 122B as sources of the nanocrystals 20 during a sputtering process, and the density of the nanocrystals 20 may be controlled by power densities applied to the targets 122A and 122B as the sources of the nanocrystals 20 during the sputtering process.

Any substrate S may be used so long as it is suitable for the preparation of a thin film. A substrate formed of a material, such as glass, GaAs, quartz, $LiNbO_3$, $LiTaO_3$, silicon (Si), SiC, $SiO_2$, ZnO, MgZnO, sapphire, platinum (Pt), or SiN, may be used, and for example, in one embodiment, a sapphire substrate or a SiN substrate is used. For example, in one embodiment, a process pressure is in a range of about 0.1 Pa to about 1 Pa. The sputtering process may be performed at a low temperature. For example, in one embodiment, the sputtering process is performed at about 100° C.

A thickness of the thin film 10 is not particularly limited and may be increased according to process time. However, the thickness of the thin film 10 may be about 100 nm or less in order to reduce the process time and secure the stability of the process.

Figure 2:
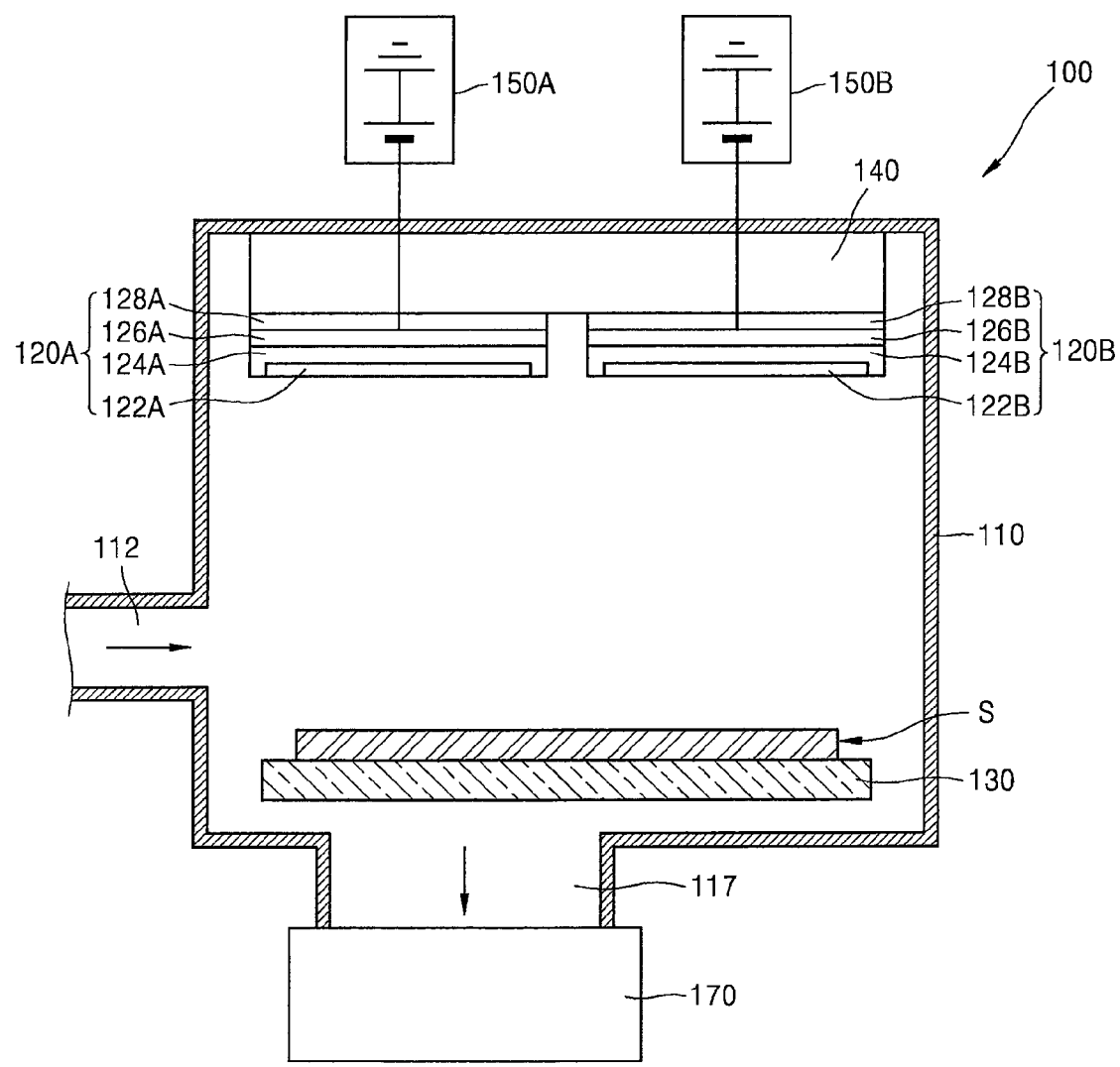
FIG. 2 is a schematic view illustrating a sputtering apparatus according to an embodiment of the present invention.

FIG. 2 is a schematic view illustrating a sputtering apparatus 100 according to an embodiment of the present invention. Referring to FIG. 2, in one embodiment, the sputtering apparatus 100 includes a chamber 110 providing a space for the sputtering process, target units (or targets) 120A and 120B respectively disposed (or located) in the chamber 110 and having materials to be deposited on the substrate S mounted therein, a substrate mounting unit 130 disposed (or positioned) to face the target units 120A and 120B and for stably placing the substrate S thereon, and a pump 170 coupled to an exhaust pipe 117 of the chamber 110.

The chamber 110 provides a space for performing a sputtering process and a deposition process, wherein in one embodiment the chamber 110 further includes a gas inlet 112 that provides reaction gas for generating plasma between the targets 122A and 122B and the substrate mounting unit 130, and the exhaust pipe 117 for exhausting residual reaction gas. The residual reaction gas may be easily exhausted without using a separate exhaust pump by coupling the exhaust pipe 117 to the vacuum pump 170 controlling the pressure in the chamber 110. Herein, the reaction gas may be argon (Ar) gas which may generate plasma at a low electric power in order to reduce (or prevent) damage to the substrate S stably placed on the substrate mounting unit 130.

A process pressure in the chamber 110 may be in a range of about 0.1 Pa to about 1 Pa. The sputtering process may be performed at a low temperature. For example, in one embodiment, the sputtering process is performed at a temperature in the chamber of about 100° C.

In one embodiment, the substrate S is mounted on the substrate mounting unit 130, and the substrate mounting unit 130 supports the substrate S to face the target units 120A and 120B.

A target transfer unit (or target transferor) 140 is a device for transferring the target units 120A and 120B, wherein the target transfer unit 140 may induce uniform sputtering on the substrate S by transferring the target units 120A and 120B. The target transfer unit 140 may horizontally or vertically move or rotate the target units 120A and 120B.

In one embodiment, the two target units 120A and 120B are located at a region facing the substrate S in the chamber 110. The two target units 120A and 120B may be positioned next to each other while facing the substrate S. The target units 120A and 120B may respectively include targets 122A and 122B, target plates 124A and 124B, cathode plates 126A and 126B, and magnets 128A and 128B.

In one embodiment, a sputtering phenomenon occurs in which ions in the chamber 110 that have been generated by accelerated electrons collide with the targets 122A and 122B to allow materials on surfaces of the targets 122A and 122B to escape therefrom. The materials that escape from the surfaces of the targets 122A and 122B are deposited on the substrate S to form a thin film, and an organic light-emitting display apparatus may be realized by using the thin film.

The targets 122A and 122B may be formed of different materials. The thin film 10, including the nanocrystals 20, may be formed on the substrate S by using the targets 122A and 122B formed of mutually different materials. For example, in one embodiment, if any one of the targets 122A and 122B is formed of tin oxide and the other one is formed of aluminum oxide, tin or aluminum nanocrystals are formed in an amorphous thin film, including tin oxide and aluminum oxide, on the substrate S. Thus, voltages having different values may be applied to the targets 122A and 122B in order to form the thin film 10 including the nanocrystals 20.

Next, in one embodiment, the target plates 124A and 124B fix the targets 122A and 122B, which are the sources of materials deposited on the substrate S by sputtering. The cathode plates 126A and 126B are positioned on the target plates 124A and 124B and are coupled to a power supply unit (or power supply) to apply voltages to the targets 122A and 122B. In addition, the magnets 128A and 128B apply magnetic fields in order to reduce the possibility of (or prevent) the escape of electrons generated from plasma to other parts of the sputtering apparatus 100.

The power supply unit (or power supplier) is coupled to the cathode plates 126A and 126B in the chamber 110 to apply voltages thereto, and thus generates the plasma between the substrate S and the targets 122A and 122B.

Voltage supply units (or voltage suppliers) 150A and 150B may respectively apply different values of voltages to the target 122A and the target 122B. For example, in one embodiment, a first voltage is applied to the target 122A, and a second voltage that is higher than the first voltage is applied to the target 122B. Voltage application times of the voltage supply unit 150A and the voltage supply unit 150B may differ. For example, in one embodiment, when a period of time (e.g., a set or predetermined period of time) elapses after the voltage supply unit 150A applies the first voltage to the target 122A, the voltage supply unit 150B applies the second voltage to the target 122B. Thus, the base metal compound may be formed from the target 122A, and the nanocrystals 20 may be formed from the target 122B.

Figure 3:
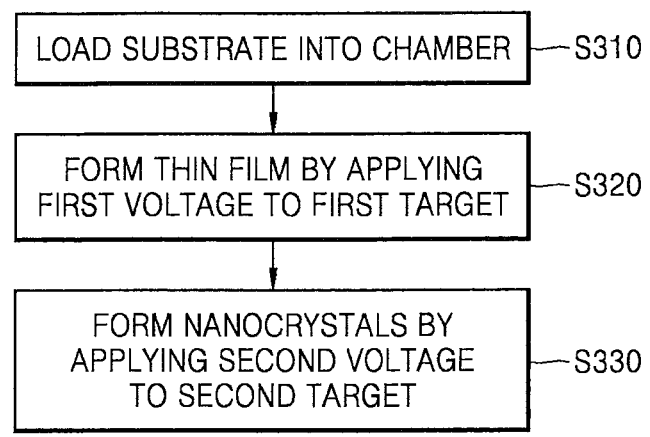
FIG. 3 is a flowchart illustrating a method of forming a thin film including nanocrystals, according to an embodiment of the present invention.

FIG. 3 is a flowchart illustrating a method of forming the thin film 10 including the nanocrystals 20, according to an embodiment of the present invention.

In this embodiment, the substrate S is loaded on the substrate mounting unit 130 of the chamber 110 (S310). Reaction gas, such as Ar gas, is provided to a space in the chamber 110 through the gas inlet 112.

In a case where a material formed on the substrate S by the sputtering apparatus 100 according to the embodiment of the present invention is a material including oxygen or nitrogen, i.e., an oxide or a nitride, oxygen or nitrogen is introduced into the chamber 110, in addition to the Ar gas. A pressure in the chamber 110 may be in a range of about 0.1 Pa to about 1 Pa. Also, a temperature in the chamber 110 may be about 100° C. or less.

Thereafter, a first voltage is applied to the target 122A to form a thin film on the substrate S by sputtering (S320). Specifically, when the first voltage is applied to the target 122A through the voltage supply unit 150A, sputtering plasma is generated in the chamber 110. In one embodiment, the plasma is composed of γ-electrons, cations, anions, and/or the like. The sputtering plasma collides with the target 122A, and particles sputtered from the target 122A, i.e., a first metal compound, are deposited on the substrate S. Because, in one embodiment, the first metal compound is formed at a low temperature, the first metal compound may be amorphous. The first voltage may be in a range from about 100 V to about 150 V.

A thickness of the thin film 10 may be determined by the application time of the voltage applied to the target 122A. For example, the longer the application time of the voltage applied to the target 122A is, the larger the thickness of the thin film 10 may become.

The thin film 10 is formed, and a second voltage is then applied to the target 122B to form nanocrystals by sputtering (S330). Specifically, when the second voltage is applied to the target 122B through the voltage supply unit 150B, sputtering plasma is generated in the chamber 110. The second voltage may be higher than the first voltage, and for example, may be in a range from about 150 V to about 200 V. In one embodiment, the plasma is composed of γ-electrons, cations, anions, and/or the like. The sputtering plasma collides with the target 122B, and the thin film 10 is doped with particles sputtered from the target 122B, i.e., a second metal compound. The thickness of the thin film 10 may be slightly increased due to the doping with the second metal compound.

Because, in one embodiment, the second metal compound is formed by a voltage difference greater than that of the first metal compound, the thin film 10 may be doped with the second metal compound at a rate faster than that of the first metal compound. Because the first metal compound is doped with the second metal compound at a fast rate and the second metal compound may collide with the first metal compound, a portion of the first metal compound or the second metal compound may be crystallized. Therefore, oxygen or nitrogen of the first metal compound or the second metal compound in the thin film 10 may escape from metals, and the metals may be crystallized. The crystallized metals may have a nanoscale diameter. For example, the diameter of the nanocrystals 20 may be in a range from about 1 nm to about 20 nm.

The diameter of the nanocrystals 20 may be determined by a value of the voltage applied to the target 122A. For example, the higher the voltage applied to the target 122A is, the larger the diameter of the nanocrystals 20 may be. Also, a density of the nanocrystals 20 may be determined by a doping amount of the second metal compound. For example, the higher the doping amount of the second metal compound is, the higher the density of the nanocrystals 20 may be.

In FIG. 3, and in one embodiment, the thin film 10, including the nanocrystals 20, is formed by applying a voltage to the target 122B after a voltage is applied to the target 122A. However, embodiments of the present invention are not limited thereto. In another embodiment, the thin film 10, including the nanocrystals 20, may be formed by intermittently applying a voltage to the target 122B during the application of a voltage to the target 122A.

COMPARATIVE EXAMPLE

Figure 4:
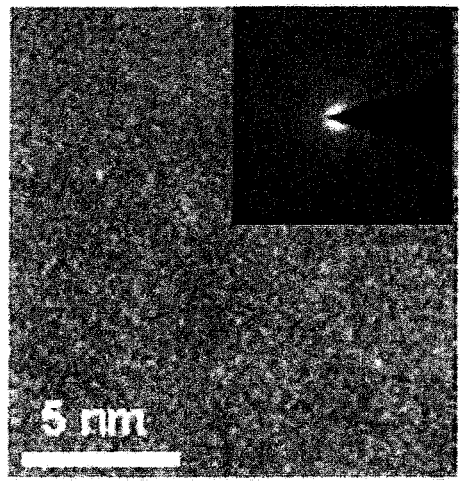
FIG. 4 is a transmission electron micrograph of a tin oxide thin film grown by a low temperature process.

As a comparative example, a tin oxide thin film was grown to a thickness of about 50 nm by reactive sputtering at a vacuum pressure and room temperature. FIG. 4 shows a transmission electron micrograph of the tin oxide thin film grown by a low temperature process. As illustrated in FIG. 4, a diffraction pattern was absent in the micrograph. Therefore, it may be confirmed that the tin oxide thin film grown by a low temperature process was amorphous.

EXAMPLE

Figure 5:
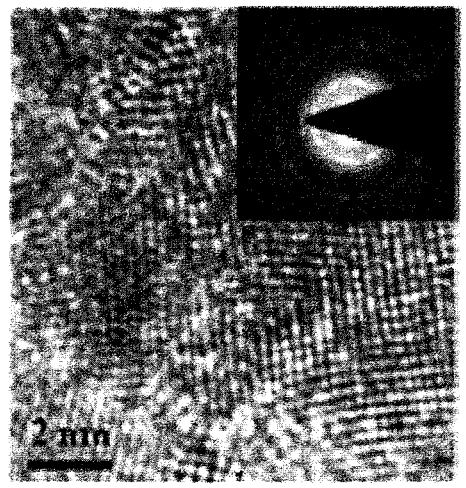
FIG. 5 is a transmission electron micrograph of a tin oxide thin film doped with aluminum oxide.

A first voltage (about 150 V) was applied to the target 122A formed of tin oxide to form a tin oxide thin film by sputtering at a vacuum pressure and room temperature. A second voltage (about 200 V) that was higher than the first voltage was applied to the target 122B formed of aluminum oxide to dope the tin oxide thin film with aluminum oxide by sputtering. FIG. 5 is a transmission electron micrograph of the tin oxide thin film doped with aluminum oxide. As illustrated in FIG. 5, a diffraction pattern was presented in the micrograph. Therefore, it may be confirmed that crystals were formed by doping the tin oxide thin film with aluminum oxide.

Figure 6:
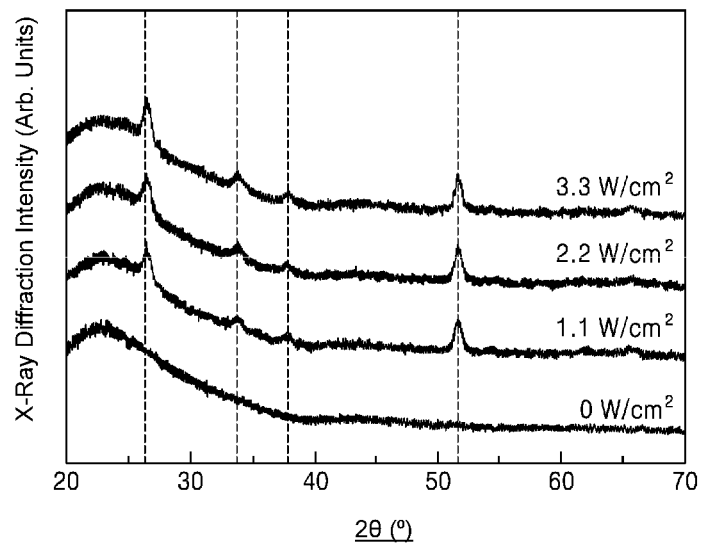
FIG. 6 is a graph illustrating changes in the density of a thin film according to an increase in a doping amount of aluminum oxide.

FIG. 6 is a graph illustrating changes in the density of a thin film according to an increase in a doping amount of aluminum oxide. The tin oxide thin film was doped with aluminum oxide at power densities of 0 W/cm², 1.1 W/cm², 2.2 W/cm², and 4.4 W/cm². As illustrated in FIG. 6, it may be confirmed that the density of the thin film increased as the doping amount of the aluminum oxide increased. That is, in a case where it is desired to form a higher-density amorphous thin film including nanocrystals, the doping amount of the second metal compound may be increased.

Figure 7:
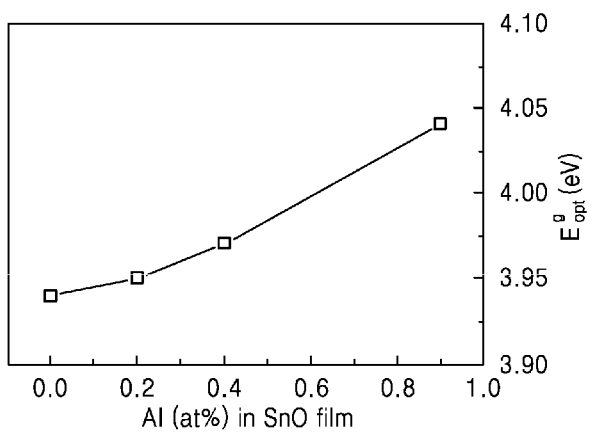
FIG. 7 is a graph illustrating optical bandgap energy of thin films according to the increase in the doping amount of aluminum oxide.

FIG. 7 is a graph illustrating optical bandgap energy of thin films according to an increase in the doping amount of aluminum oxide. As illustrated in FIG. 7, the optical bandgap energy of a tin oxide thin film having no aluminum was about 3.93 eV. However, when aluminum was included in an amount of about 1% in a tin oxide thin film, the optical bandgap energy of the thin film increased to about 4.04 eV, meaning that defects, which may be included in the thin film, were mitigated (or removed).

Thus, in a case of forming a metal compound thin film, if a heterogeneous metal compound is deposited, a crystalline phase may be obtained during the formation of the thin film due to fast sputtered particles.

In the present example, the heterogeneous metal compound is deposited by sputtering. However, embodiments of the present invention are not limited thereto. The targets may be formed of the same metal compound, and a thin film, including nanocrystals, may be formed by differing values of the voltages applied to the targets.

The above-described thin film, including nanocrystals, may be used as a component of an organic light-emitting display apparatus. For example, an encapsulation layer of the organic light-emitting display apparatus may be formed as the above-described thin film including nanocrystals.

Figure 8:
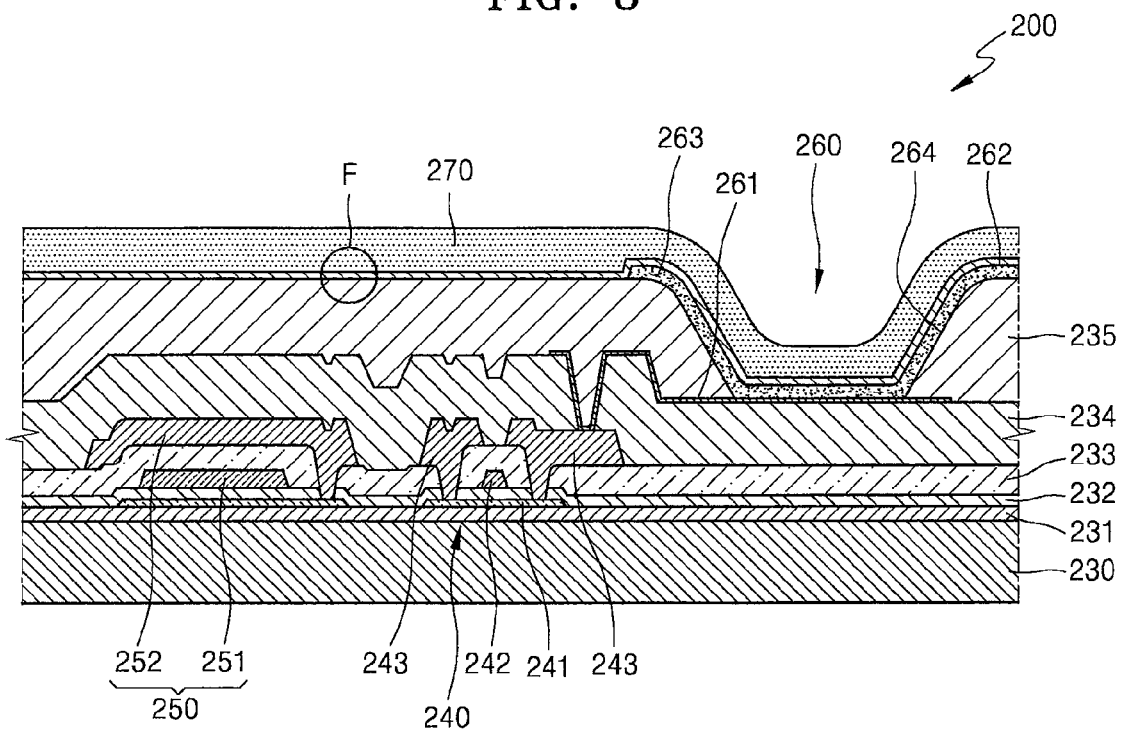
FIG. 8 is a cross-sectional view schematically illustrating an organic light-emitting display apparatus according to an embodiment of the present invention.
Figure 9:
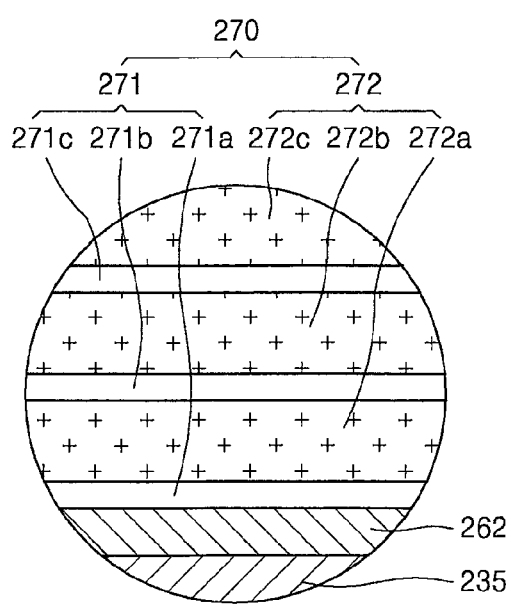
FIG. 9 is an enlarged view of region F shown in FIG. 8.

FIG. 8 is a cross-sectional view schematically illustrating an organic light-emitting display apparatus 200 according to an embodiment of the present invention, and FIG. 9 is an enlarged view of region F shown in FIG. 8.

In one embodiment, the organic light-emitting display apparatus 200 is formed on a substrate 230. The substrate 230 may be formed of glass, plastic, or metal.

A buffer layer 231 is formed on the substrate 230, wherein the buffer layer 231 provides a flat surface on the substrate 230 and contains an insulator to reduce (or prevent) the penetration of moisture and foreign matter in a direction toward the substrate 230.

A thin film transistor (TFT) 240, a capacitor 250, and an organic light-emitting device 260 are formed on the buffer layer 231. The thin film transistor 240 mainly includes an active layer 241, a gate electrode 242, and source/drain electrodes 243. The organic light-emitting device 260 includes a first electrode 261, a second electrode 262, and an intermediate layer 263.

The capacitor 250 includes a first capacitor electrode 251 and a second capacitor electrode 252.

Specifically, the active layer 241 is positioned on a top surface of the buffer layer 231 in a pattern (e.g., a predetermined pattern). The active layer 241 may contain an inorganic semiconductor material, such as silicon, an organic semiconductor material, or an oxide semiconductor material, and may be formed by implanting a p-type or n-type dopant. The first capacitor electrode 251 is formed at the same layer as the gate electrode 242, and the first capacitor electrode 251 may be formed of the same material as that of the gate electrode 242.

A gate dielectric layer 232 is formed on the active layer 241. The gate electrode 242 is formed on the gate dielectric layer 232 so as to correspond to the active layer 241. An interlayer dielectric 233 is formed to cover the gate electrode 242, and the source/drain electrodes 243 are formed on the interlayer dielectric 233 to be in contact with areas (e.g., predetermined areas) of the active layer 241. The second capacitor electrode 252 is formed at the same layer as the source/drain electrodes 243, and the second capacitor electrode 252 may be formed of the same material as that of the source/drain electrodes 243.

A passivation layer 234 is formed to cover the source/drain electrodes 243, and a separate insulation layer may be further formed on the passivation layer 234 for the planarization of the thin film transistor 240.

The first electrode 261 is formed on the passivation layer 234. The first electrode 261 is formed to be electrically coupled to any one of the source/drain electrodes 243. A pixel-defining layer 235 is formed to cover the first electrode 261. An opening 264 (e.g., a predetermined opening) is formed at the pixel-defining layer 235, and the intermediate layer 263, including an organic light-emitting layer, is then formed in a region limited by the opening 264. The second electrode 262 is formed on the intermediate layer 263.

An encapsulation layer 270 is formed on the second electrode 262. The encapsulation layer 270 may contain an organic material or an inorganic material, and may have a structure in which the organic material and the inorganic material are alternatingly stacked.

The encapsulation layer 270 may be formed by using the above-described method of forming a thin film 10 including the nanocrystals 20 of embodiments of the present invention. That is, a thin film may be formed on a substrate having the second electrode 262 formed thereon.

In one embodiment, the encapsulation layer 270 includes an inorganic layer 271 and an organic layer 272, in which the inorganic layer 271 includes a plurality of layers 271a, 271b, and 271c, and the organic layer 272 includes a plurality of layers 272a, 272b, and 272c. The plurality of layers 271a, 271b, and 271c of the inorganic layer 271 may be formed of the above-described metal oxide thin film including nanocrystals.

As described above, a thin film including nanocrystals may be formed by sputtering at a low temperature. Therefore, the density and optical properties of the thin film may be increased (or improved).

Also, an organic light-emitting display apparatus may be manufactured by using the thin film having increased (or improved) density and optical properties.

While aspects of the present invention has been particularly shown and described with reference to exemplary embodiments thereof, it will be understood by those of ordinary skill in the art that various changes in form and detail may be made therein without departing from the spirit and scope of the present invention as defined by the following claims, and equivalents thereof.

What is claimed is:

1. A method of forming nanocrystals, the method comprising:
loading a substrate into a chamber;
applying a first voltage to a first target to form a thin film comprising a first metal compound on the substrate by sputtering;
after forming the thin film, applying a second voltage to a second target and forming nanocrystals in the thin film by sputtering; and
wherein the second voltage is higher than the first voltage.

2. The method of claim 1, wherein the first target and the second target comprise different metals.

3. The method of claim 1, wherein the first metal compound is a metal oxide or a metal nitride.

4. The method of claim 1, wherein a diameter of the nanocrystals is determined by a value of the voltage applied to the second target.

5. The method of claim 1, wherein the forming of the nanocrystals comprises doping the thin film with a second metal compound from the second target.

6. The method of claim 5, wherein a density of the nanocrystals is determined by a doping amount of the second metal compound.

7. The method of claim 1, wherein the first metal compound is amorphous.

8. The method of claim 1, wherein a thickness of the thin film is about 100 nm or less.

9. The method of claim 1, wherein a process temperature in the chamber is about 100° C. or less.

10. The method of claim 1, wherein a density of the thin film is increased by the formation of the nanocrystals.

11. The method of claim 1, wherein optical bandgap energy of the thin film is increased by the formation of the nanocrystals.

12. The method of claim 1, wherein the nanocrystals are formed by crystallization of at least one metal of the first metal compound and a second metal compound from the second target.

13. The method of claim 1, wherein the first metal compound comprises at least one of $SnO_x$, ZnO, $TiO_x$, indium tin oxide (ITO), and $WO_x$.

14. A thin film having nanocrystals formed by the method of forming nanocrystals of claim 1.

15. A method of manufacturing an organic light-emitting display apparatus, the method comprising:
    loading a substrate comprising at least some components of the organic light-emitting display apparatus into a chamber;
    applying a first voltage to a first target to form a thin film comprising a first metal compound on the substrate by sputtering;
    after forming the thin film, applying a second voltage to a second target and forming nanocrystals in the thin film by sputtering; and
    wherein the second voltage is higher than the first voltage.

16. The method of claim 15, wherein the organic light-emitting display apparatus comprises: a first electrode; an intermediate layer comprising an organic light-emitting layer; a second electrode; and an encapsulation layer; the electrodes and layers being on the substrate and
    the thin film having the nanocrystals formed therein is included in the encapsulation layer.

17. The method of claim 16, wherein the encapsulation layer comprises an organic layer and an inorganic layer.

18. The method of claim 17, wherein the inorganic layer comprises the thin film comprising the nanocrystals.

19. The method of claim 15, wherein the thin film is amorphous.

* * * * *